United States Patent [19]

Hartleroad et al.

[11] 3,868,759

[45] Mar. 4, 1975

[54] MAGNETIC PRE-ALIGNMENT OF SEMICONDUCTOR DEVICE CHIPS FOR BONDING

[75] Inventors: Ronald J. Hartleroad, Twelve Mile; James P. Grabowski, Carmel, both of Ind.

[73] Assignee: General Motors Corporation, Detroit, Mich.

[22] Filed: Nov. 9, 1973

[21] Appl. No.: 414,272

[52] U.S. Cl. .................. 29/464, 29/203 P, 214/1 R, 214/152, 198/254

[51] Int. Cl. .............................................. B23q 3/18

[58] Field of Search ........... 29/203 P, 203 J, 203 V, 29/203 MM, 464, 589, 576 S, 626, 628, 471.1; 228/4–6; 214/1 R, 152; 198/254

[56] References Cited

UNITED STATES PATENTS

| | | | |
|---|---|---|---|
| 3,128,544 | 4/1964 | Allingham | 29/471.1 X |
| 3,341,030 | 9/1967 | Engels | 214/152 X |
| 3,612,955 | 10/1971 | Butherus et al. | 29/471.1 X |
| 3,731,377 | 5/1973 | Muckelroy | 29/626 |
| 3,776,394 | 12/1973 | Miller | 214/1 R |

*Primary Examiner*—Al Lawrence Smith
*Assistant Examiner*—K. J. Ramsey
*Attorney, Agent, or Firm*—Robert J. Wallace

[57] ABSTRACT

Apparatus and a method for generally aligning semiconductor device chips having soft ferromagnetic leads with conductive lead frame structures prior to bonding thereto. The chips are prealigned in a temporary chip carrier and transported to a bonding station without losing their prealigned position. A vibratory force applied to the carrier and a magnetic plate below the carrier are used to bring the integral chip leads into close proximity with their corresponding lead frame fingers to promote subsequent consistent precisely aligned engagement therebetween.

3 Claims, 7 Drawing Figures

MAGNETIC PRE-ALIGNMENT OF SEMICONDUCTOR DEVICE CHIPS FOR BONDING

BACKGROUND OF THE INVENTION

This invention relates to a method and apparatus for positioning integrally leaded semiconductor device chips prior to bonding to a conductive lead frame structure. More particularly, it relates to a method and apparatus for prealigning the integral chip leads in spaced relation with corresponding lead frame fingers so as to facilitate subsequently magnetically raising the chip into consistent precise engagement with the fingers for bonding thereto.

This invention is used in conjunction with the inventions described and claimed in U.S. patent application Ser. No. 414,273, Hartleroad et al., entitled "Multiple Magnetic Alignment for Semiconductor Device Bonding", and U.S. patent application Ser. No. 414,501 Hartleroad et al., entitled "Laminated Template for Semiconductor Device Bonding". The patent applications referred to disclose methods and apparatus for magnetically transferring integrally leaded semiconductor device chips to overlying conductive lead frame structures for bonding, while simultaneously registering them in the process. These applications generally involve placing integrally leaded semiconductor device chips into each of a plurality of recesses in a template which serves as a temporary chip carrier. A lead frame having a plurality of sets of convergent fingers is positioned over the template so that a finger set overlies each chip within the template recess. A magnetic force is utilized to raise the chips from their respective templates recess into precisely aligned engagement with their corresponding lead frame fingers.

The recesses in the templates have a flat bottom portion which is somewhat larger than the backside of the chips to be placed therein. This is to facilitate easy placement of the chips in the recesses since in production the width of a particular kind of device may vary from chip to chip. This allows the chips some rotational freedom within their respective recess. Hence, it is improbable that the chips will be exactly aligned with their overlying set of lead frame fingers before being raised up into engagement therewith. We have discovered that if all the chips are fairly closely prealigned before being raised into engagement with the lead frame fingers, a higher yield of precisely aligned integral chip lead-finger engagement can be consistently obtained. In this manner, extremely high yields of acceptable bonded products can be obtained.

In commercial production operations using the inventions of the aforementioned U.S. patent application Ser. No. 414,501 and No. 414,273, the template is loaded with the semiconductor chips, and the lead frame mounted thereover in a subassembly. This preferably occurs at some time before bonding and often at a work station some distance from the actual bonding station. It would be advantageous to prealign all of the chips at the work station in which the template is loaded with chips and lead frame mounted thereon to form a subassembly. It is important that this prealignment be maintained while transporting the subassembly to the bonding station. Through the use of our invention, integrally leaded semiconductor device chips can be prealigned in spaced relation with corresponding fingers of an overlying lead frame structure and this prealignment can be maintained during transportation to various work stations in production.

OBJECTS AND SUMMARY OF THE INVENTION

Therefore, it is an object of this invention to provide a method and apparatus for preligning integrally leaded semiconductor device chips with corresponding fingers of a conductive lead frame to facilitate subsequent magnetic transfer and consistent precision aligned engagement therebetween for bonding.

It is a further object of this invention to provide a method and apparatus for maintaining such prealignment between various work stations in production.

These and other objects of the invention are achieved by placing a semiconductor device chip having a plurality of soft ferromagnetic leads on one face thereof into each of a plurality of recesses in a template which serves as a temporary chip carrier. A conductive lead frame structure is positioned so that a set of soft ferromagnetic fingers overlies each chip in the template recesses. A plate having two major faces serving as two opposing poles of a magnet is placed coextensive and contiguous the backside of the template. The plate, template, and lead frame are secured in mutual registration to form a subassembly. The subassembly is then vibrated for a short period of time to prealign all of the chips with their corresponding finger sets so that the integral chip leads are in close proximity but spaced from their corresponding lead frame fingers. In a preferred embodiment, the magnetic plate is a rubber strip having a plurality of soft ferromagnetic pins for use with a template having openings extending from the recesses so that the pins may be partially inserted therein.

DESCRIPTION OF THE PREFERRED EMBODIMENTS

Figure 1:
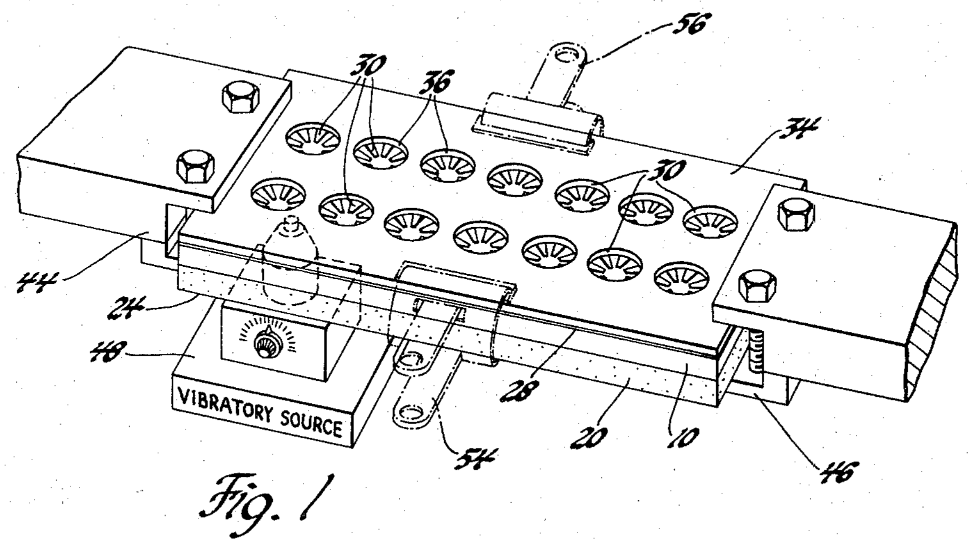
FIG. 1 shows an isometric view of the apparatus made in accordance with this invention.
Figure 2:
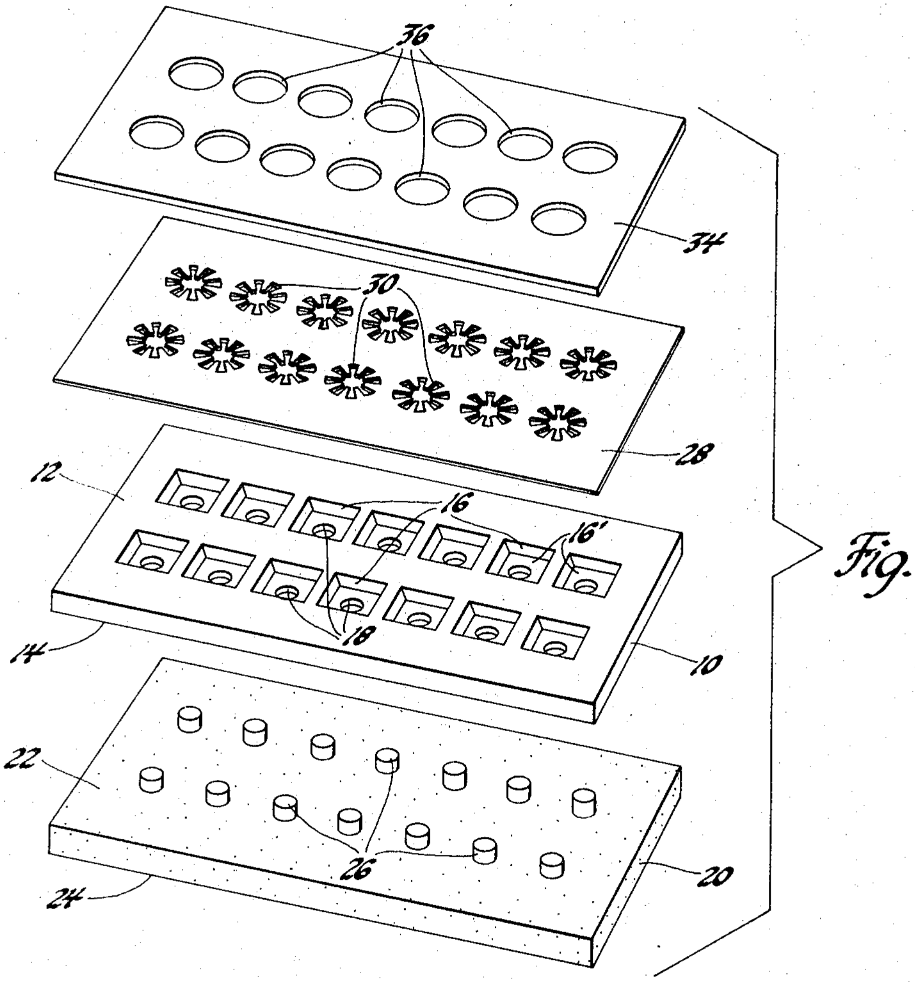
FIG. 2 shows an exploded isometric view of various elements shown in FIG. 1.
Figure 3:
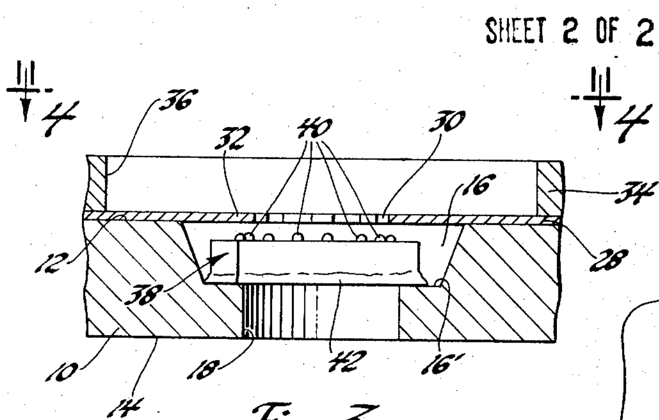
FIG. 3 shows a fragmentary sectional view in partial elevation of a semiconductor flip chip in a template recess before prealignment.

FIGS 1–6 of the drawings show a template 10 similar to that disclosed in U.S. patent application Ser. No. 414,501 Hartleroad et al., entitled "Laminated Template for Semiconductor Device Bonding", which is filed concurrently with the present application. The template 10 has two major parallel surfaces 12 and 14. Located in spaced rows and columns in surface 12 is a plurality of recesses 16. Circular openings 18 extend from the bottom portion 16' of the recesses 16 to the opposite template surface 14.

Magnetic rubber strip 20 has two major parallel faces 22 and 24. Magnetic rubber strip 20 has peripheral dimensions the same as that of template 10 and is approximately one-eighth inch thick between faces 22 and 24. The magnetic rubber strip 20 has ferrite particules impregnated therein. The ferrite particules have been permanently molecularly aligned by an external magnetic field. This molecular alignment gives the rubber strip 20 magnetic properties in which the faces 22 and 24 act as opposing poles of a magnet. The magnetic rubber strip 20 can be that which is distributed under the trade name "Magnetico" by Magnetico Company. While the rubber strip is preferred, a metallic plate which has been magnetically polarized so that its two major faces act as opposing poles of a magnet can be used.

Pins 26 extend transversely through the thickness of the magnetic rubber strip 20 and extend vertically from face 22. The pins 26 are located in spaced rows and columns which correspond to the openings 18 in template 10. The pins 26 are a soft ferromagnetic material such as soft iron. The pins 26 have a circular cross-section which is slightly less than the openings 18 in the template 10 so that the pins can be easily inserted in their corresponding template openings, as can be seen most clearly in FIG. 5.

A lead frame structure 28 is constructed of a soft ferromagnetic material such as Alloy 42 which has been coated with a thin layer of gold. Alloy 42 is an alloy containing, by weight, about 41.5% nickel, 0.05% carbon, 0.5% manganese, 0.25% silicon, and the balance iron. The lead frame 28 has peripheral dimensions similar to that of template 10 and is approximately 25 mils thick. The lead frame 28 has a plurality of sets 30 of mutually spaced inwardly converging cantilevered fingers 32, with the sets being spaced from each other in rows and columns corresponding to recesses 16 in the template. The fingers in each set have free inner ends 32' arranged in a predetermined pattern which corresponds to the contact bump pattern on the semiconductor flip chip, as will be hereinafter described. The gold plated Alloy 42 lead frame has provided extremely satisfactory results. However, it appears that it is most important that only the lead frame fingers need be of the soft ferromagnetic material. If so, then only these portions need be of Alloy 42, of the like, and the balance of the lead frame can be of any other material.

A cover plate 34 is generally coextensive to the lead frame 28 and is constructed of SAE 300 series stainless steel which is approximately one-sixteenth inch thick. The cover plate 34 has a plurality of circular openings 36 therethrough which correspond to the sets 30 of lead frame fingers 32.

According to the method of our invention, semiconductor flip chips 38 are placed one each in the plurality of recesses 16 of the template 10. The semiconductor flip chip 38 is an integrated circuit device die measuring approximately 11 to 13 mils thick between its major faces and is approximately 38 mils square. The flip chip 38 has spaced contact bumps 40 on its upper major face equally spaced about its periphery Each individual contact bump is approximately 0.8 mil high and 3.8 mils square. For ease of illustration, the contact bumps 40 are shown enlarged with respect to the chip 38. The contact bumps are a composite of layers of aluminum, chromium, nickel, tin and gold, with the outermost layer being gold to permit making a eutectic bond with the gold plated lead frame. While the foregoing bump construction is preferred, it can be varied. However, the nickel content should be at least about 30% and, preferably, about 60% by volume of the total contact bump volume, as is the case in this example.

The nickel content provides a low reluctance path by which magnetic flux lines can readily pass through the contact bumps. The greater than 30% by volume nickel in effect gives the contact bumps the characteristics of a soft ferromagnetic material. By soft ferromagnetic material we mean a material having a high overall magnetic permeability and a low residual magnetization, which a low coercive field required It should be noted that although nickel has been found to be the most practical metal to be used in production, other metals such as soft iron may be substituted therefor. If still other soft ferromagnetic materials are substituted, a larger volume proportion may be required if such other materials have a significantly lower magnetic permeability or other related magnetic characteristics, as should be understood by those skilled in the art. The flip chips 38 are placed in their respective template recess so that the face containing the integral leads or contact bumps is oriented upwardly.

Figure 4:
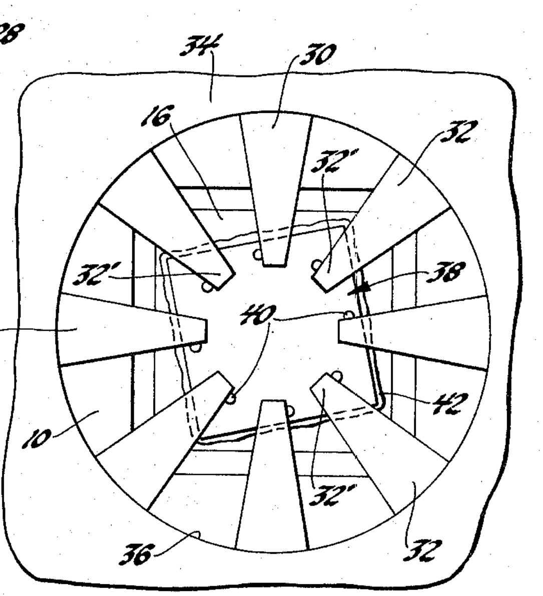
FIG. 4 shows a top plan view along the lines 4—4 of FIG. 3.

As can be seen most clearly in FIG. 4, the flip chips 38 tends not to be centered in their respective template recesses 16 when they are placed therein. As noted in the Background of the Invention, the recesses 16 have flat bottom portions 16' which are oversized in comparison with the back side of the chips to allow ease of placement of the chips in the template recesses and to allow for variation in the size of the chips which inherently occur in production thereof, such as burr portion 42 which extends laterally from the lower side portion of the chip.

After the chips have been placed in their respective template recesses 16, the lead frame 28 is positioned contiguous and coextensive to template surface 12 so that a set 30 of fingers overlie each chip. The cover plate 34 is placed on top of the lead frame 28 to sandwich it between the template 10 and to hold the lead frame as much in the same plane as possible. However, due to the extreme thinness of the lead frame, some bowing of the lead frame often occurs.

The magnetic rubber strip 20 is brought into aligned relation with the underside of the template 10 so that the template surface 14 and the magnetic rubber strip face 22 are contiguous and so that the pins 26 extend partially through the template opening 18. The magnetic rubber strip 20, the template 10, the lead frame 28, and the cover plate 34 form a subassembly. The subassembly is held in mutual registration by means of supporting clamps 44 and 46 as can be seen in FIG. 1. A vibratory force 48 has an extrusion which abuts the face 24 of magnetic rubber strip 20. The vibratory source 48 can be a typical pulse generator applying pulses at a rate of about 1,000 cycles per second. It appears that the placement of the point of abutment of the vibratory source is not critical as long as it touches a portion of the subassembly or the supporting clamp 44 and/or 46. Furthermore, the vibratory force can be that supplied by a typical hand engraver.

Figure 5:
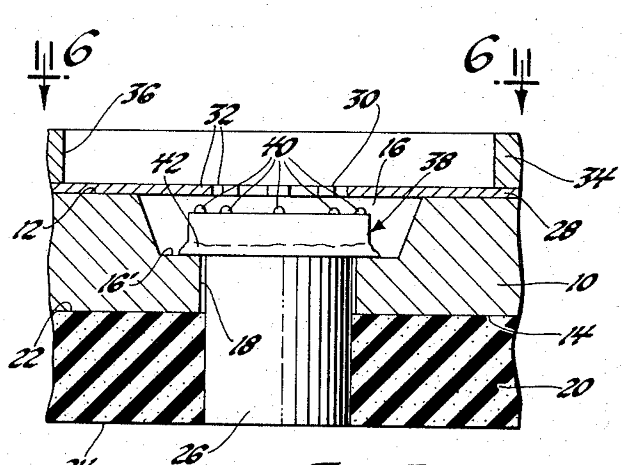
FIG. 5 shows a fragmentary sectional view in partial elevation similar to FIG. 3 but after prealignment.
Figure 6:
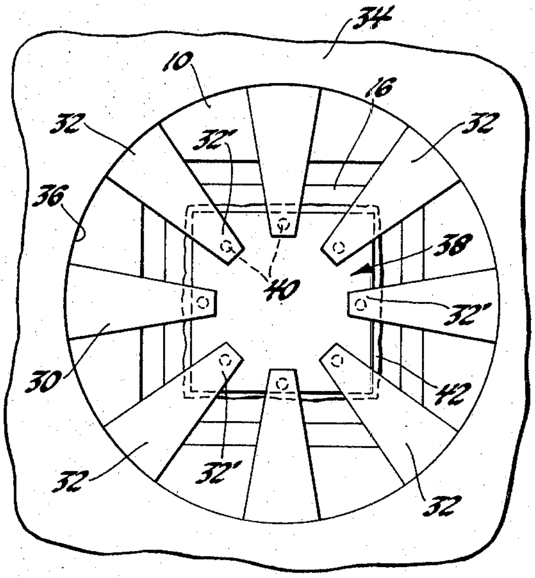
FIG. 6 shows a top plan view along the lines 6—6 of FIG. 5

The vibratory force 48 is activated for a period of about 1–3 seconds. This vibratory force causes all of the flip chips to become automatically centered in their respective template recesses 16 so that the chip contact bumps 40 are vertically spaced from but in close proximity with their corresponding finger-free ends, as can be seen at FIGS. 5 and 6. By close proximity, we mean that the contact bumps are brought to within 3 mils horizontal spacing of a respective finger-free end, and that the bump pattern is oriented within 20° Θ of the finger-free end pattern, where theta (Θ) is measured with respect to an imaginary axis perpendicular to lead frame and passing through the center of the finger set.

It is believed that the vibration from the vibratory source breaks the surface adhesion between the chips and the bottom portion of the template recesses. Once the adhesion is broken, the magnetic field from the magnetic rubber strip coacts with the soft ferromagnetic contact bumps and overlying lead frame fingers to prealign the contact bumps with their corresponding finger-free ends. We refer to this as prealignment since the chips are further finely aligned when they are brought into engagement with the overlying finger sets for permanently bonding thereto. The soft ferromagnetic pins 26 further concentrate the magnetic force from the magnetic rubber strip 20 in the areas of the center of the recesses 16. Hence, the magnetic lines of flux are transmitted through the pins 26, the soft ferromagnetic contact bumps 40, and the fingers 32 of the lead frame. It should be noted that while the magnetic force from the rubber strip has enough strength to prealign the chips with their respective lead frame fingers, the magnetic force is not great enough to propel the chips to the fingers as is disclosed in the referenced applications noted in the Background of the Invention. Another function of the magnetic rubber strip 20 is to pull the lead frame 28 flat against the template surface 12 so that the vibration does not inadvertently turn the flip chips on its side and wedge it between the lead frame fingers and the template recess bottom portion.

After prealignment the subassembly can be transported to various work stations in production. A second pair of temporary clamps 54 and 56 can be employed to hold the subassembly together once it has been removed from supporting clamps 44 and 46. The magnetic force from the magnetic rubber strip 20 holds the chips flat against the recess bottom portion in their prealigned position. The magnetic rubber strip 20 and temporary clamps 54, 56 can be removed once the subassembly has reached the bonding station. It is at this station that the chips are to be magnetically raised into precisely aligned engagement with the fingers as described in the referenced U.S. patent application Ser. No. 414,501 Hartleroad et al., "Laminated Template for Semiconductor Device Bonding". As hereinbefore explained, a more consistent exactly aligned engagement is promoted since the chips are prealigned with their corresponding lead frame fingers thus resulting in increased yields during production. After the chip has been so engaged to the lead frame fingers, it is permanently bonded thereto by a blast of hot gas which temporarily melts the outer surfaces of the contact bumps and lead frame fingers. The hot gas is then removed to form a permanent mechanical and electrical bond therebetween.

Figure 7:
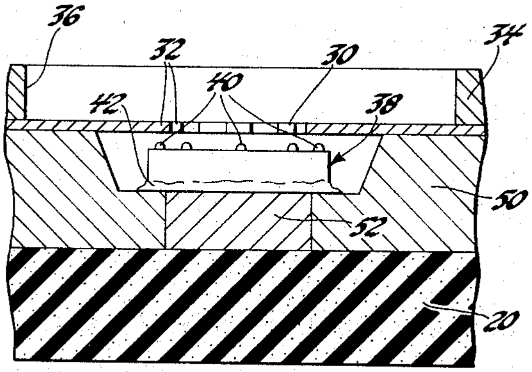
FIG. 7 shows a fragmentary sectional view in partial elevation of another embodiment of this invention after prealignment.

While this invention has thus far been described in connection with the particular template disclosed in U.S. patent application Ser. No. 414,501, Hartleroad et al., it can also be applied to the template disclosed in U.S. patent application Ser. No. 414,273, Hartleroad et al. A portion of this template is shown in FIG. 7. The primary difference between the template 50 shown in FIG. 7 and the template 10 shown in FIGS. 1–6 is that the template 50 has cores 52 of soft ferromagnetic material in the areas of the openings 18 of template 10. If such a cored template is to be employed, there is no need for the pins 26 in the magnetic rubber strip 20. The cores 52 in the template 50 serve a similar purpose as the pins 26, in that they concentrate magnetic lines of flux from a magnetic field source.

One of the further advantages in using the present invention is that all of the chips are prealigned with one short burst of vibration. This reduces the chance that the burr portions 42 may break off the chips and produce debris in the template recesses. Such debris could effect the yields in production if it became wedged between the chip contact bumps and the lead frame fingers during bonding. It should be noted that other semiconductor device chips having soft feromagnetic integral leads, for example beam lead devices, can be prealigned in accordance with the method and apparatus of this invention. Therefore, although this invention has been described in connection with particular examples thereof, no limitation is intended thereby except as defined in the appended claims.

We claim:

1. Apparatus for prealigning semiconductor device chips having soft ferromagnetic integral leads thereon with corresponding fingers of a lead frame structure to promote subsequent consistent precision engagement therebetween for bonding, said apparatus comprising:

a template having two major parallel surfaces and a plurality of recesses in one of said surfaces;

a conductive lead frame structure having sets of soft ferromagnetic fingers said sets being located in said lead frame so as to correspond to said template recesses, said lead frame fingers having free end portions which correspond to the integral lead pattern on a semiconductor device chip;

a first means for holding the lead frame substantially against said one template surface;

a magnetic plate coextensive and contiguous the opposite surface of the template, said plate having two major faces serving as opposing poles of a magnet;

a second means for concentrating the magnetic force from the plate in the areas of the template recesses;

means for temporarily securing said first means, said lead frame, said template, and said magnetic plate together in mutual registration wherein said sets of lead frame fingers overlie said template recesses; and means for vibrating said template so that all of the semiconductor device chips in the template recesses are automatically prealigned, with the integral chip leads being brought into close proximity with their corresponding lead frame finger-free ends thereby promoting subsequent consistent precision engagement therebetween for bonding.

2. Apparatus for prealigning semiconductor device chips having soft ferromagnetic integral leads thereon with conductive lead frame structures to promote subsequent consistent precision engagement therebetween for bonding, said apparatus comprising:

a template having two major parallel surfaces, a plurality of recesses in one of said surfaces, said recesses being located in spaced rows and columns, said recesses having an opening extending to the opposite surface of said template;

a conductive lead frame structure having sets of soft ferromagnetic fingers, said sets being located in spaced rows and columns corresponding to said template recesses, said lead frame fingers having free ends corresponding to the integral lead pattern on the semiconductor chips to be located in the template recesses;

a first means for holding said lead frame substantially against said one template surface;

a rubbery strip coextensive and contiguous the opposite surface of the template, said strip having two major faces serving as opposite poles of a permanent magnet, soft ferromagnetic pins extending from one face of said rubbery strip, said pins being located in spaced rows and columns corresponding to said openings in said template, said pins being inserted in said openings so that said pins extend partially therethrough;

means for temporarily securing said first means, said lead frame, said template, and said rubbery strip together in mutual registration wherein said sets of lead frame fingers overlie said template recesses and said pins remain inserted in the template openings; and means for vibrating said template so that all of the semiconductor chips located in the template recesses can be automatically prealigned, with the integral chip leads being brought into close proximity with their overlying corresponding lead frame finger-free ends thereby promoting subsequent consistent precision engagement therebetween for bonding.

3. A method of prealigning integrally leaded semiconductor device chips with conductive lead frame structures to promote a consistent precise subsequent engagement therebetween for bonding, said method comprising the steps of:

placing a semiconductor device chip having a plurality of soft ferromagnetic integral leads on one face thereof into each of a plurality of recesses in one surface of a template, with said chip face oriented upwardly;

positioning a conductive lead frame structure having sets of soft ferromagnetic fingers corresponding to the integral chip leads on said one template surface so that a set of lead frame fingers overlie each of the template recesses;

placing a magnetic plate contiguous and coextensive with the backside of said template, said plate being a permanent magnet with the major faces of the plate serving as opposite poles of the magnet;

holding said template, said lead frame, and said magnetic plate together in mutual registration to form a subassembly;

vibrating said subassembly for a short period of time so that all of said chips are automatically prealigned, with the integral chip leads being in close proximity with their corresponding lead frame fingers; and transporting said subassembly to a bonding station without disturbing said prealignment, said prealignment promoting a consistent precision engagement after the chips have been magnetically transferred and oriented into engagement with the lead frame fingers for bonding thereto.

* * * * *